(12) United States Patent
Chung et al.

(10) Patent No.: US 7,087,987 B2
(45) Date of Patent: Aug. 8, 2006

(54) TAPE CIRCUIT SUBSTRATE AND SEMICONDUCTOR CHIP PACKAGE USING THE SAME

(75) Inventors: Ye-Chung Chung, Suwon-si (KR); Chung-Sun Lee, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 30 days.

(21) Appl. No.: 10/892,360

(22) Filed: Jul. 16, 2004

(65) Prior Publication Data

US 2005/0046033 A1 Mar. 3, 2005

(30) Foreign Application Priority Data

Sep. 3, 2003 (KR) .............. 10-2003-0061498

(51) Int. Cl.
*H01L 23/495* (2006.01)
(52) U.S. Cl. .............. 257/676; 257/700; 257/712; 438/113
(58) Field of Classification Search ............. 257/676
See application file for complete search history.

(56) References Cited

U.S. PATENT DOCUMENTS

| | | | | |
|---|---|---|---|---|
| 5,639,989 A | * | 6/1997 | Higgins, III | 174/35 MS |
| 6,150,193 A | * | 11/2000 | Glenn | 438/113 |
| 6,414,382 B1 | * | 7/2002 | Hashimoto | 257/676 |
| 2002/0000654 A1 | | 1/2002 | Matsuda | |
| 2003/0168969 A1 | * | 9/2003 | Tanabe | 313/500 |

FOREIGN PATENT DOCUMENTS

| | | |
|---|---|---|
| JP | 2251159 | 10/1990 |
| KR | 10-0225924 | 7/1999 |
| KR | 2002-0065705 | 8/2002 |

OTHER PUBLICATIONS

Notice of Examination Report, dated Jul. 8, 2005.

* cited by examiner

*Primary Examiner*—David Nelms
*Assistant Examiner*—Dao H. Nguyen
(74) *Attorney, Agent, or Firm*—Harness, Dickey & Pierce, P.L.C.

(57) ABSTRACT

A tape circuit substrate and semiconductor chip package using the same. The tape circuit substrate may comprise a base film which may be made of an insulating material and may be formed with via-holes at portions thereof, a first wiring pattern layer which may be formed on a first surface of the base film, and at least one second wiring pattern layer which may be formed on a second surface of the base film and electrically connected to a terminal which may be formed on the first surface through conductive materials, or plugs, filled in the via-holes. The semiconductor chip package may comprise a semiconductor chip which may be electrically bonded to the tape circuit substrate through chip bumps.

26 Claims, 7 Drawing Sheets

TAPE CIRCUIT SUBSTRATE AND SEMICONDUCTOR CHIP PACKAGE USING THE SAME

CROSS REFERENCE TO RELATED APPLICATIONS

This application claims priority of Korean Patent Application No. 10-2003-0061498 filed on Sep. 3, 2003 in the Korean Intellectual Property Office, the disclosure of which is incorporated herein in its entirety by reference.

1. Field of the Invention

The present invention relates to a semiconductor device, and more particularly, to a tape circuit substrate and semiconductor chip package using the same.

2. Description of the Conventional Art

Tape circuit substrates are increasingly being used in semiconductor chip mounting technology. The tape circuit substrate may be configured such that wiring pattern layers and leads connected to the wiring pattern layers may be formed on a thin film which may be made of an insulating material such as polyimide resin. TAB (Tape Automated Bonding) technology, which may be used for collectively bonding leads of the tape circuit substrate to bumps formed on a semiconductor chip may be applied to the tape circuit substrate. The tape circuit substrate may be referred to as a TAB tape.

Referring to FIG. 1, the conventional art tape circuit substrate 100 may be configured such that wiring pattern layers 140 may be formed on an insulating base film 120 which may be made of a material such as polyimide resin by selective etching of a copper foil through the laminating and photoetching processes. The wiring pattern layers 140 may be covered with and protected by a protection film 130 which may be made of solder resist. Inner leads 140a, which may be connected to the wiring pattern layers 140, may also be exposed from the protection film 130 and may protrude into a window 110.

Referring to FIG. 2, the conventional art tape carrier package 200 (hereinafter referred to as "TCP") may be configured such that a semiconductor chip 180 with a chip bump 150, which may be formed thereon, may be mounted by the TAB technology on the tape circuit substrate 100 and may be configured as shown in FIG. 1. The TCP may be a connection technology or packing method of bonding a tape circuit substrate, in which a metal pattern may be formed on an insulating polyimide film, to the semiconductor chip on which the chip bump may be formed. The tape circuit substrate may function as a lead frame which may be used in packaging processes.

The chip bump 150, which may be formed on an electrode pad 160, may be connected to the inner leads 140a of the tape circuit substrate 100 such that the semiconductor chip 180 may be connected to the tape circuit substrate. Electrical connections between the semiconductor chip 180 and the tape circuit substrate 100, the main surface and sides of the semiconductor chip 180, and the exposed inner leads 140a may be protected from external environments by a sealing portion 170 which may be made of resin or the like.

FIGS. 3a and 3b are top plan views showing the arrangements of electrode pads 220 and 240 which may be formed on the semiconductor chip 180 and may be mounted on TCP 200.

A plurality of the electrode pads 220, which may be electrically connected to the inner leads 140a and may be formed on the tape circuit substrate 100, may be arranged in a single row on the semiconductor chip 180 as shown in FIG. 3a, or a plurality of the electrode pads 240 may be staggered in two rows on the semiconductor chip 180 as shown in FIG. 3b. The pitch between two adjacent electrode pads may be on the order of 35 µm.

A chip pad pitch on the order of 35 µm may be too small for a semiconductor chip package which may use the tape circuit substrate as in the aforementioned TCP. As the pitch of leads exposed to the window decreases, the processing of the tape circuit substrate may be limited. Leads, which may be formed on the tape circuit substrate, may be exposed to the external environment until they may be sealed and the leads may be deformed and/or damaged during the assembly process. Thus, it may be difficult to apply tape circuit substrate to a TCP with a pitch less than 35 µm.

To achieve a pitch in a TCP, the width of leads thereof may be narrowed, which may lead to the weakening of the leads. Thus, it may be difficult to obtain a finer pitch TCP, and it may be difficult to make a chip more compact. The "broken lead" phenomenon, wherein the leads may be easily broken due to a small impact, may become more common. Also, conductive foreign substances may be attached to the lead which may be bonded during the assembling process, and electrical malfunction may occur.

SUMMARY OF THE INVENTION

Exemplary embodiments of the present invention may provide a tape circuit substrate, a semiconductor chip package, and an LCD apparatus which may use the same. Exemplary embodiments of the present invention may be directed to reducing the chip size and/or the frequency of the broken lead phenomenon.

In an exemplary embodiment of the present invention, there may be provided a tape circuit substrate, which may comprise a base film which may be made of an insulating material and may be formed with at least one via-hole at least one portion thereof, a first wiring pattern layer which may be formed on at least one portion of a first surface of the base film, and at least one second wiring pattern layer, which may be formed on a second surface and may be electrically connected to a terminal formed on the first surface through conductive materials which may be filled in the at least one via-hole.

In exemplary embodiments of the present invention, a wiring on the first wiring pattern layer and a wiring on the at least one of the at least one of the second wiring pattern layer may overlap each other. The first and second wiring pattern layers may be sealed by a protection film, which may be made of solder resist. When there are two or more second wiring pattern layers, an insulating film may be formed between the second wiring pattern layers such that the second wiring pattern layers may be electrically insulated from one another, and the insulating film may be made of solder resist.

Wirings on the second wiring pattern layer may be located between wirings on the first wiring pattern layer and the first and second wiring pattern layers may be sealed by a protection film. The protection film may be made of solder resist.

An insulating film may be formed between the second wiring pattern layers such that the second wiring pattern layers may be electrically insulated from one another, and the insulating film may be made of solder resist. The wiring on the first wiring pattern layer and the wiring on the second wiring pattern layer may not overlap each other.

The via-holes may be formed in one or more rows.

In another exemplary embodiment of the present invention, there may be provided a semiconductor chip package, which may comprise a tape circuit substrate including a base film, which may be made of an insulating material and may be formed with at least one via-hole at least one portion thereof; a first wiring pattern layer which may be formed on at least portion of a first surface of the base film; and at least one second wiring pattern layer which may be formed on at least a portion of a second surface of the base film and may be electrically connected to a terminal, which may be formed on the first surface, through conductive materials filled in the at least one via-hole; and a semiconductor chip which may include a plurality of electrode pads with bonded portions, which may be formed thereon at a surface thereof, wherein the semiconductor chip may be bonded to the first wiring pattern layer and a terminal of the at least one second wiring pattern layer on the surface, through the bonded portions, such that the semiconductor chip may be mounted on the tape circuit substrate.

A wiring on the first wiring pattern layer and a wiring on the at least one of the at least one second wiring pattern layer may overlap each other. The bonded portions may be chip bumps.

The semiconductor chip package may further comprise a sealing portion which may seal electrical connections between the tape circuit substrate and the semiconductor chip with an insulation sealing resin. An insulating film may be formed between the second wiring pattern layers such that the second wiring pattern layers may be electrically insulated from one another. The insulating film may be made of solder resist.

In another exemplary embodiment of the present invention, there may be provided an LCD package which may comprise a tape circuit substrate including a base film, which may be made of an insulating material and may be formed with at least one via-hole at least one portion thereof; a first wiring pattern layer which may be formed on at least portion of a first surface of the base film; and at least one second wiring pattern layer which may be formed on at least a portion of a second surface of the base film and may be electrically connected to a terminal, which may be formed on the first surface, through conductive materials filled in the at least one via-hole; a semiconductor chip which may include a plurality of electrode pads with bonded portions, which may be formed thereon at a surface thereof, wherein the semiconductor chip may be bonded to the first wiring pattern layer and a terminal of the at least one second wiring pattern layer on the surface, through the bonded portions, such that the semiconductor chip may be mounted on the tape circuit substrate; and an LCD panel which may include, at least one panel pattern which may be formed at a surface thereof, and may be bonded to at least one of the at least one second wiring patter layers, through a conductive film.

The conductive film may be anisotropic conductive film. A wiring on the first wiring pattern layer and a wiring on the at least one of the at least one second wiring pattern layer may overlap each other. The bonded portions may be chip bumps.

The LCD package may further comprise a sealing portion which may seal electrical connections between the tape circuit substrate and the semiconductor chip with an insulation sealing resin. An insulating film may be formed between the second wiring pattern layers such that the second wiring pattern layers may be electrically insulated from one another. The insulating film may be made of solder resist.

BRIEF DESCRIPTION OF THE DRAWINGS

Exemplary embodiments, features and advantages of the present invention will now be discussed in conjunction with the accompanying drawings, in which.

DETAILED DESCRIPTION OF EXEMPLARY EMBODIMENTS OF THE INVENTION

Exemplary embodiments of the present invention will be described in detail with reference to the accompanying drawings such that those skilled in the art can easily carry out the present invention or variants thereon.

Figure 4:
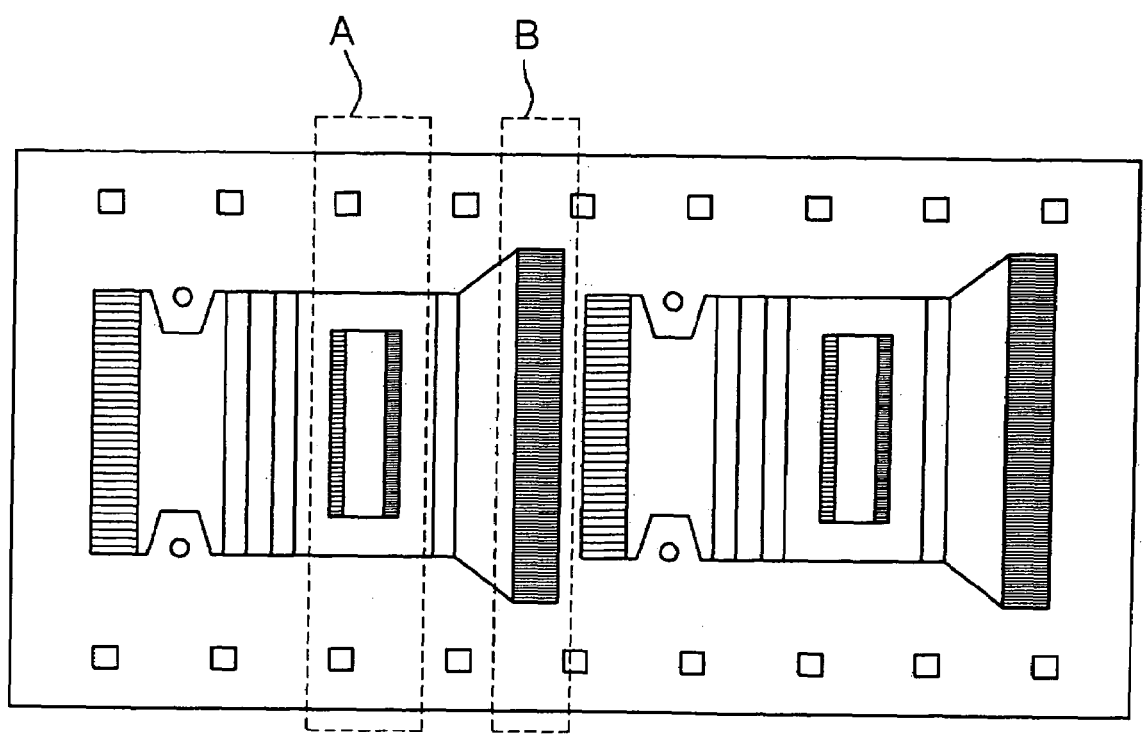
FIG. 4 is a top plan view schematically showing a tape circuit substrate according to an exemplary embodiment of the present invention.
Figure 5A:
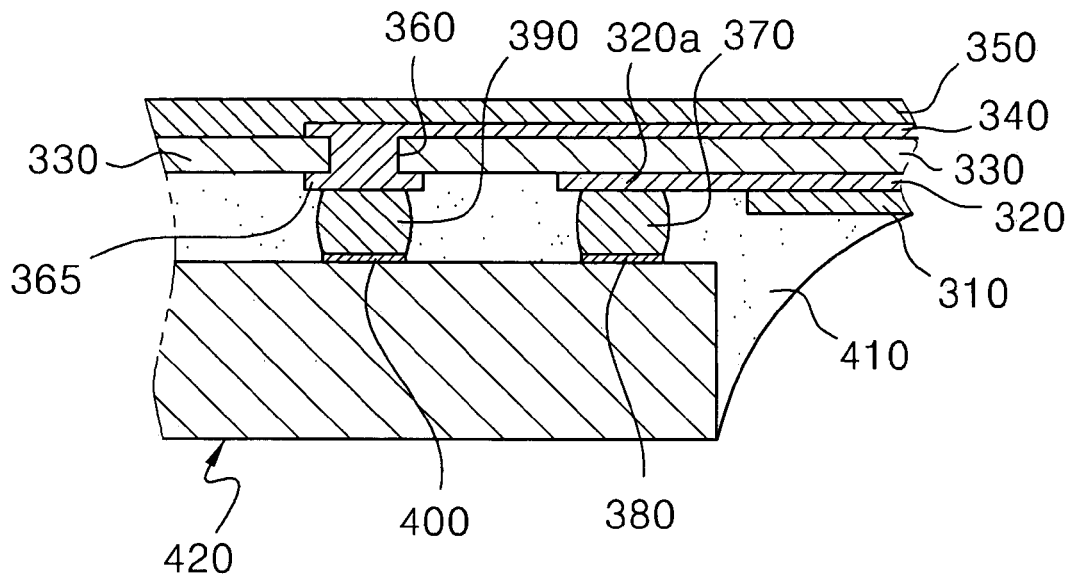
FIGS. 5a and 5b are partial sectional views of a TCP as a semiconductor chip package according to an exemplary embodiment of the present invention.
Figure 5B:
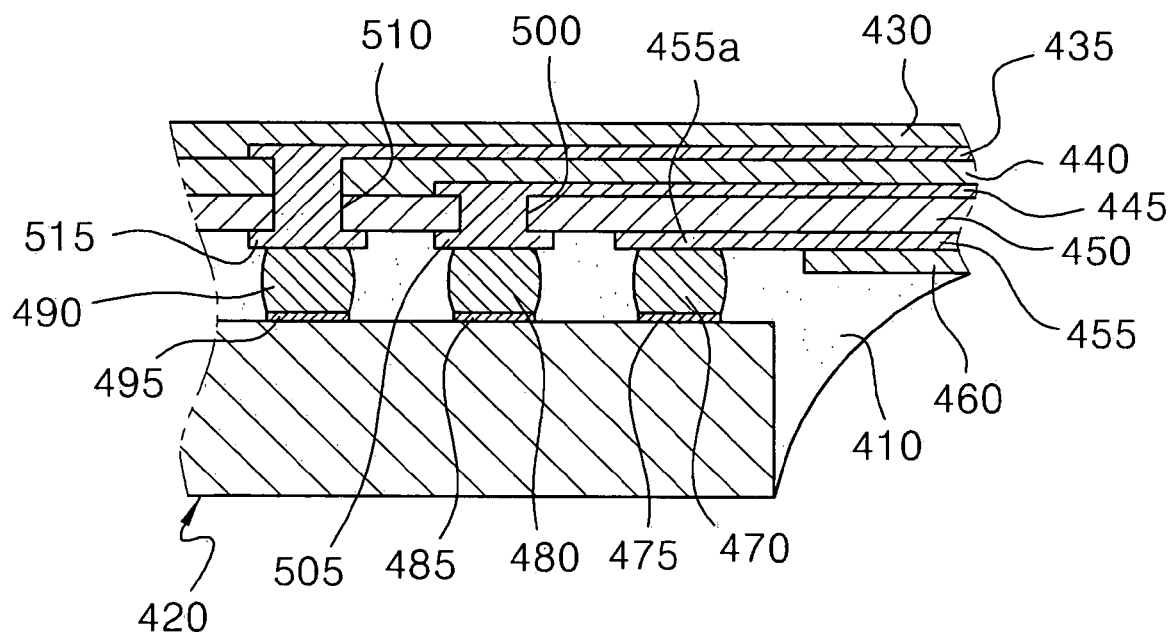

FIG. 4 is a top plan view schematically showing a tape circuit substrate according to an exemplary embodiment of the present invention. FIGS. 5a and 5b are partial sectional views of a TCP as a semiconductor chip package are also partial sectional views taken along line "A" of FIG. 4.

As shown in FIG. 5a, the semiconductor chip package which may comprise a tape circuit substrate which may include a base film 330, a first wiring pattern layer 320, a second wiring pattern layer 340, and a semiconductor chip 420, which may be electrically connected to the tape circuit substrate.

In an exemplary embodiment of the present invention, the base film 330 may be made of an insulating material with via-holes 360 formed on portions thereof. In the TCP, the base film 330 may be formed with a window at the central portion thereof which may be used to mount the semiconductor chip 420 thereon. The insulating base film 330 may be made of polyimide resin.

The via-holes 360 may be formed using a laser or punching process, and a conductive material, or plug, may be filled in the via-holes 360. The conductive material, or plug, may comprise Al, Ag, Au, Cu, Ni, mixtures thereof and the like. The via-holes 360 may be close to the window which may be formed on a center portion of the tape circuit substrate and may be formed in a row on each edge of the tape circuit substrate.

The first wiring pattern layer 320 may be formed on a first surface of the base film 330. The first wiring pattern layer 320 may be made of a conductive material which may be a copper foil. A surface of the copper foil may be plated with Sn, Au, Ni, solder, or mixtures thereof.

A method of forming the copper foil on the first surface of the base film 330 may include a casting process, a laminating process, an electroplating process, and the like. The casting process may include attaching a liquid base film to the rolled copper foil and thermally curing. The laminating process may include placing the rolled copper foil on the base film and thermally welding. The electroplating process may include depositing a copper seed layer on the base film, placing the base film into an electrolyte solution in which copper may be dissolved, and forming the copper foil by applying electricity to the electrolyte solution.

A method for forming the wiring pattern layer on the copper foil may include selectively etching the copper foil by performing a photo-etching process.

The second wiring pattern layer 340 may be formed on a second surface of the base film 330. A method of forming the second wiring pattern layer 340 may be the same as the method of forming the first wiring pattern layer 320. The second wiring pattern layer 340 so formed may be electrically connected to a terminal 365 which may be formed on the first surface of the base film 330 through the via-holes 360 with the plug filled therein.

As shown in FIG. 5a, the first wiring pattern layer 320, which may be formed on the first surface of the base film 330, may be covered with and protected by a protection film 310 which may be made of solder resist. This protection film 310 may cover the bottom surface of the base film 330 such that the first wiring pattern layer 320 may not be exposed. Inner leads 320a may be electrically connected with the semiconductor chip 420 which may not be covered by the protection film 310.

The second wiring pattern layer 340 which may be formed on the second surface of the base film 330 may also be covered with and may be protected by a protection film 350 made of solder resist. This protection film 350 may cover a top surface of the base film 330 such that the second wiring pattern layer 320 may not be exposed.

An exemplary embodiment of the present invention may comprise the TCP as shown in FIG. 5a. The tape circuit substrate may comprise a first wiring pattern layer 320 which may be formed on a first surface of a base film 330, a protection film 310 which may be for covering the wiring pattern layer 320, the second wiring pattern layer 340 which may be formed on a second surface of the base film 330, and the via-holes 360 in which the conductive material may be filled therein for potentially electrically connecting the second wiring pattern layer 340 with the terminal 365 which may be formed on the first surface of the base film 330.

Chip bumps may be used to electrically connect the tape circuit substrate with the semiconductor chip 420. The chip bumps 370 and 390 may be bonded to electrode pads 380 and 400 and may be formed on the main surface of the semiconductor chip 420 through a thermal welding process. These chip bumps 370 and 390 may be made of a variety of materials such as Au, Cu and solder, mixtures thereof and the like.

The inner leads 320a of the first wiring pattern layer 320, electrical connections between the terminal 365 of the second wiring pattern layer 340 and the semiconductor chip 420 may be sealed by a sealing portion 410 which may be made of an insulating sealing resin. The sealing portion 410 may be made of epoxy resin or silicon resin.

Figure 6A:
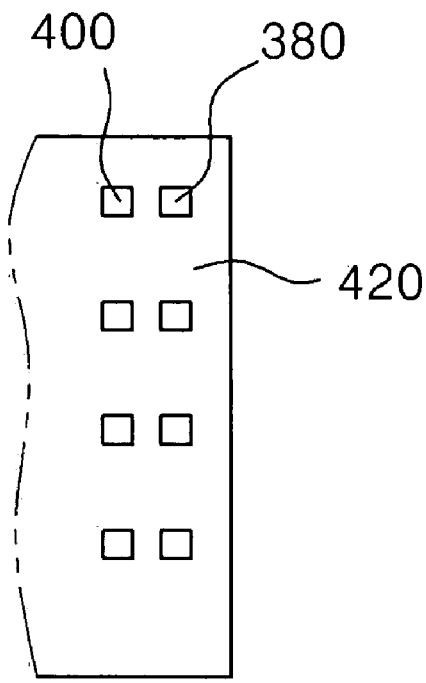
FIGS. 6a and 6b are top plan views showing the arrangements of electrode pads which may be formed on the semiconductor chip and may be mounted on the TCP according to an exemplary embodiment of the present invention.

FIG. 6a is a top plan view showing an exemplary embodiment of the present invention which may include an of electrode pads 380 and 400 which may be formed on the semiconductor chip 420. As shown in FIG. 6a, the electrode pads 380 and 400 may be arranged in two rows on each edge of the semiconductor chip 420 such that they may be connected to the inner leads 320a and the terminal 365 of the via-holes 360, which may be formed on the base film 330 through the chip bumps 370 and 390.

Another exemplary embodiment of the present invention may include a TCP with a three-layer structured wiring pattern layer. As shown in FIG. 5b, the semiconductor chip package may comprise a tape circuit substrate which may include a base film 450, a first wiring pattern layer 455, a second wiring pattern layer 445, a third wiring pattern layer 435, and a semiconductor chip 420 which may be electrically connected to the tape circuit substrate.

An exemplary embodiment of the tape circuit substrate may include the base film 450, which may be made of an insulating material, with via-holes 500 and 510 which may be formed at portions thereof. In the TCP, the base film 450 may include a window located at the central portion thereof and may be used to mount the semiconductor chip 420 thereon. The insulating base film 450 may be made of polyimide resin.

The via-holes 500 and 510 may be formed using a laser or punching process, and a conductive material may be filled in the via-holes 360. The conductive material may include, alone or in combination, Al, Ag, Au, Cu, Ni, mixtures thereof and the like. The via-holes 500 and 510 may be close to the window which may be formed on a portion of the tape circuit substrate and may be formed in two rows on the tape circuit substrate.

The first wiring pattern layer 455 may be formed on a first surface of the base film 450. The first wiring pattern layer 455 may be made of a conductive material, which may be copper foil. Sn, Au, Ni, solder, or mixtures thereof may be plated on the surface of the copper foil. A method of forming the copper foil on the first surface of the base film 450 may include a casting process, a laminating process, an electroplating process, and the like.

The wiring pattern layer may be formed on the copper foil by selectively etching by performing a photo-etching process.

The second wiring pattern layer 445 may be formed on a second surface of the base film 450. A method of forming the second wiring pattern layer 445 may be similar to the method of forming the first wiring pattern layer 455. The second wiring pattern layer 445 may be electrically connected to a terminal 505, which may be formed on the first surface of the base film 450, through the via-holes 500, which may include the conductive material filled therein.

The third wiring pattern layer 435 may be formed above the second wiring pattern layer 445. A method of forming the third wiring pattern layer 435 may be similar to the method of forming the first wiring pattern layer 455. The second wiring pattern layer 445 may be covered with and may be protected by a protection film 440 which may be made of solder resist. The protection film 440 may cover a surface of the base film 450 such that the second wiring pattern layer 445 may be electrically insulated from the third wiring pattern layer 435.

The third wiring pattern layer 435 may also be electrically connected to a terminal 515, which may be formed on the first surface of the base film 450, through via-holes 510, which may have conductive materials, or plugs, filled therein.

As shown in FIG. 5b, the first wiring pattern layer 455, which may be formed on the first surface of the base film 450, may be covered with and protected by a protection film 460 which may be made of solder resist. This protection film 460 may cover the bottom surface of the base film 450 such that the first wiring pattern layer 455 may not be exposed. Inner leads 455a, which may be electrically connected with the semiconductor chip 420, may not be covered with the protection film 460.

The second wiring pattern layer 435 may also be covered with and protected by a protection film 430 which may be made of solder resist. The protection film 430 may cover a surface of the base film 450 such that the second wiring pattern layer 435 may not be exposed.

Another exemplary embodiment of the present invention may include a tape circuit substrate which may include the first wiring pattern layer 455 which may be formed on a first surface of a base film 450, a protection film 460 which may cover the wiring pattern layer 455, a second wiring pattern layer 445 which may be formed on a second surface of the base film 450, a third wiring pattern layer 435 which may be formed above the second wiring pattern layer 445, and via-holes 500 and 510 which may include the conductive materials filled therein which may be for electrically connecting the second and third wiring pattern layers 445 and 435 with terminals 505 and 515, which may be formed on the first surface of the base film 450.

Chip bumps may be used to electrically connect the tape circuit substrate with the semiconductor chip 420. The chip bumps 470, 480 and 490 may be bonded to electrode pads 475, 485 and 495 which may be formed on a surface of the semiconductor chip 420 through a thermal welding process. These chip bumps 470, 480 and 490 may be made of, either alone or in combination, Au, Cu, solder, mixtures thereof and the like.

The inner leads 455a of the first wiring pattern layer 455 of the tape circuit substrate, electrical connections between the semiconductor chip 420, the terminals 505 and 515 of the second and third wiring pattern layers 445 and 435, and the main surface of the semiconductor chip 420 may be sealed by the sealing portion 410 which may be made of insulating sealing resin. The sealing portion 410 may be made of epoxy resin or silicon resin.

Figure 6B:
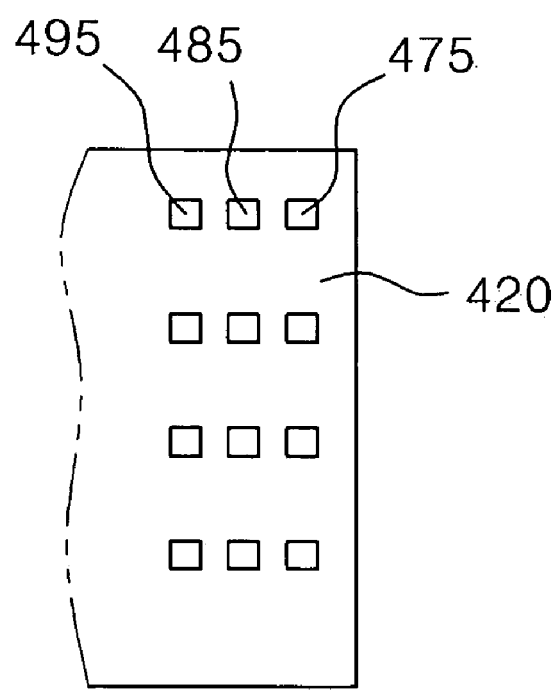

In an exemplary embodiment as shown in FIG. 6b, the electrode pads 475, 485 and 495 may be arranged in three rows on the semiconductor chip 420 such that they may be connected to the inner leads 455a and the terminals 505 and 515 of the via-holes 500 and 510, which may be formed on the base film 450 through the chip bumps 470, 480 and 490.

Figure 1:
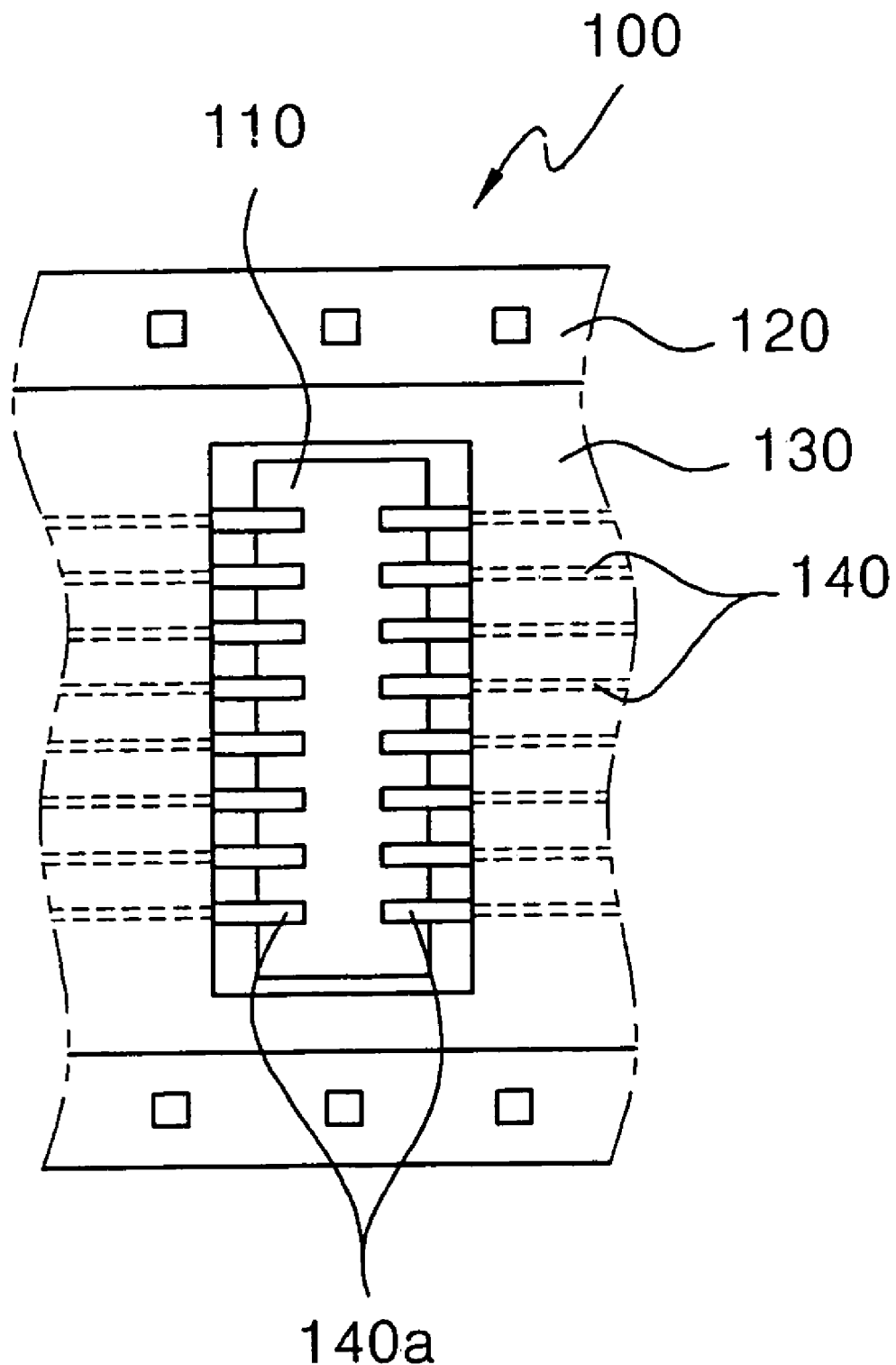
FIG. 1 is a partial plan view of a conventional tape circuit substrate.
Figure 2:
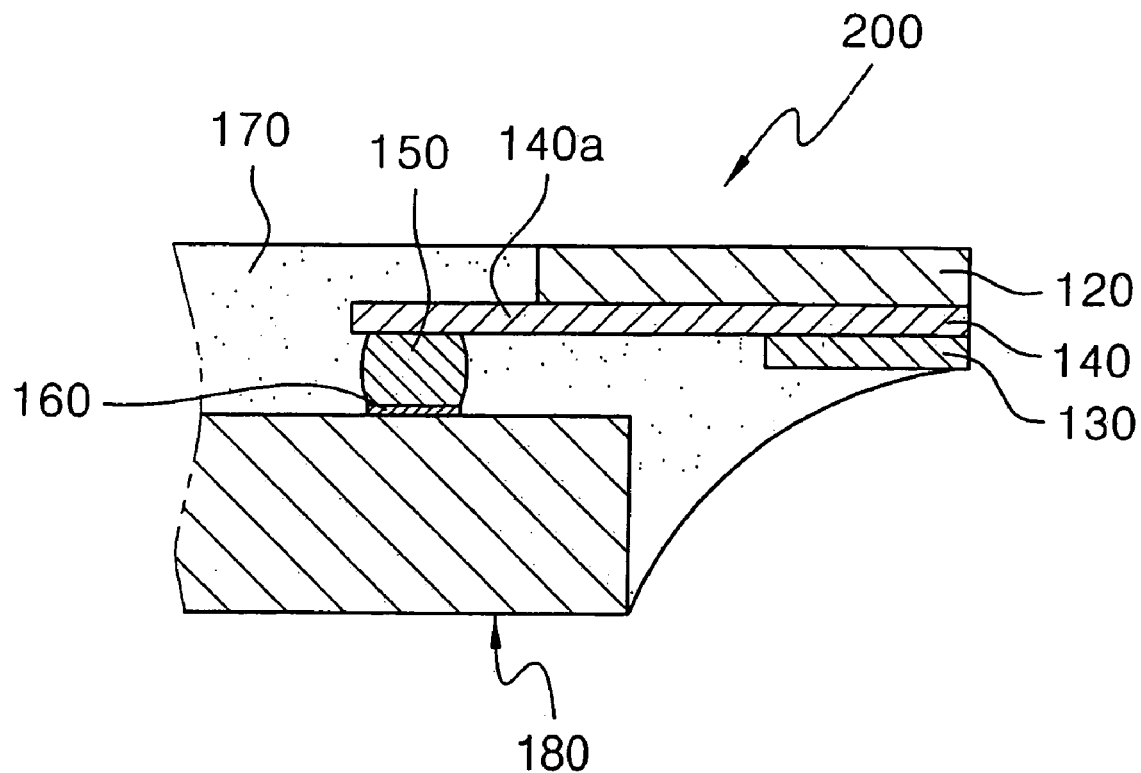
FIG. 2 is a partial sectional view of a conventional TCP as a semiconductor chip package.
Figure 3A:
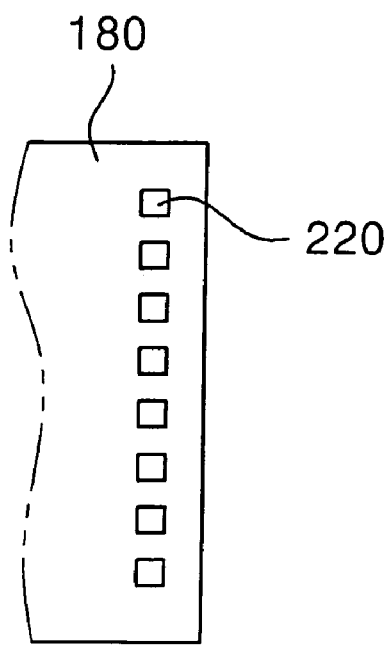
FIGS. 3a and 3b are top plan views showing the arrangements of electrode pads which may be formed on the semiconductor chip and may be mounted on a conventional TCP.
Figure 3B:
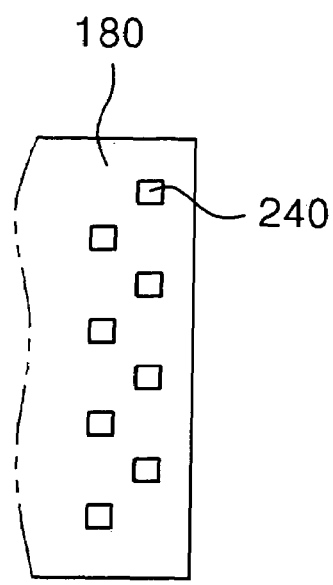

The wiring pattern layer of two- or three-layered structure has been described by way of exemplary embodiments of the present invention, but may also be applied to a wiring pattern layer of a four- or more-layered structure. FIG. 6a and FIG. 6b may show the electrode pads arranged in two and three rows, respectively, but may also combine the teachings of the invention with an offset and/or staggered arrangement as shown in FIG. 3b.

Figure 7:
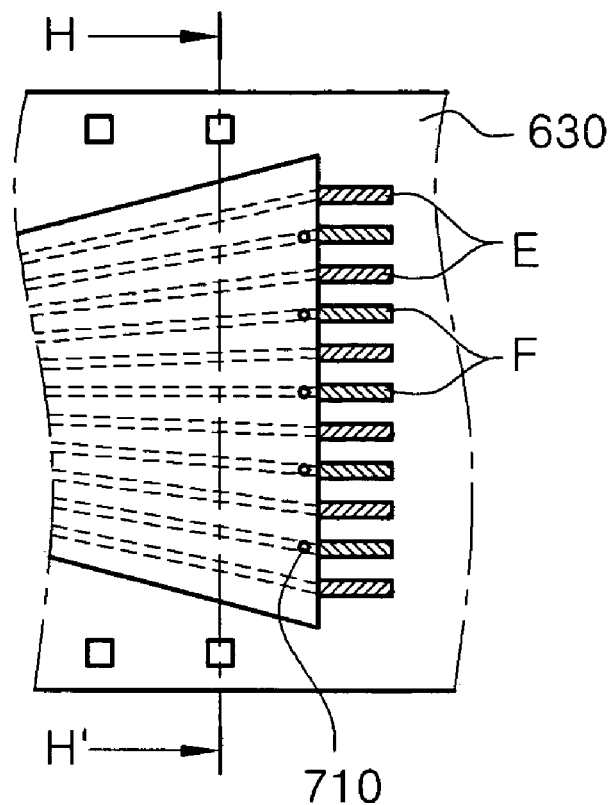
FIG. 7 is a plan view showing outer leads of the tape circuit substrate according to an exemplary embodiment of the present invention.

FIG. 7 is a top plan view showing outer leads of a tape circuit substrate according to another exemplary embodiment of the present invention and may also be an enlarged view of the portion "B" of FIG. 4. The outer leads E may be outer leads of the first wiring pattern layer 320, and the outer leads F may be outer leads of the second wiring pattern layer 340. The outer leads E and F of the tape circuit substrate 630 may be electrically connected with an LCD (Liquid Crystal Display) panel or board (such as a printed circuit board (PCB)). In an exemplary embodiment of the present invention the outer leads may be connected to an LCD panel, and the reference numeral 710 may refer to via holes 710 which may be formed in the base film 330 and may be connected with the outer leads F.

Figure 8:
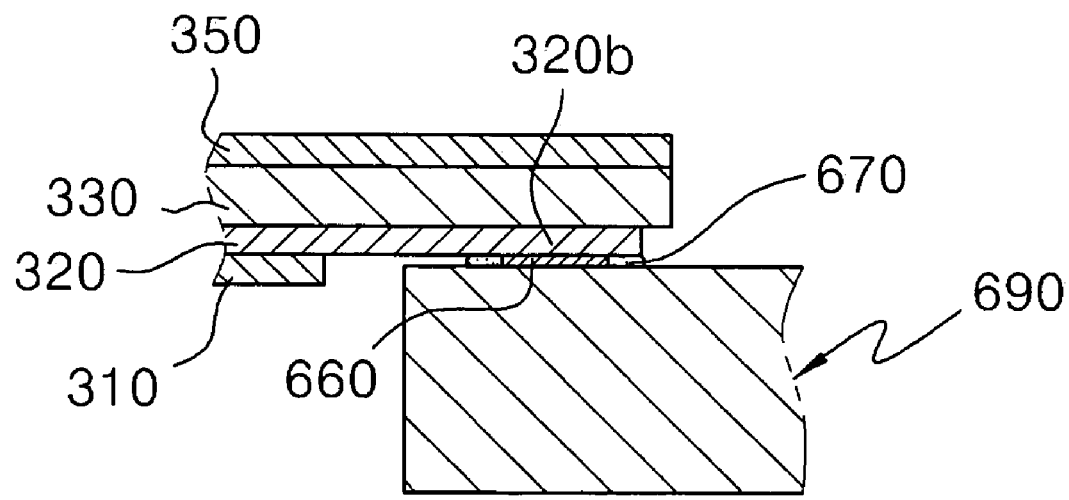
FIGS. 8 and 9 are partial sectional views showing the outer leads of the tape circuit substrate according to an exemplary embodiment of the present invention.
Figure 9:
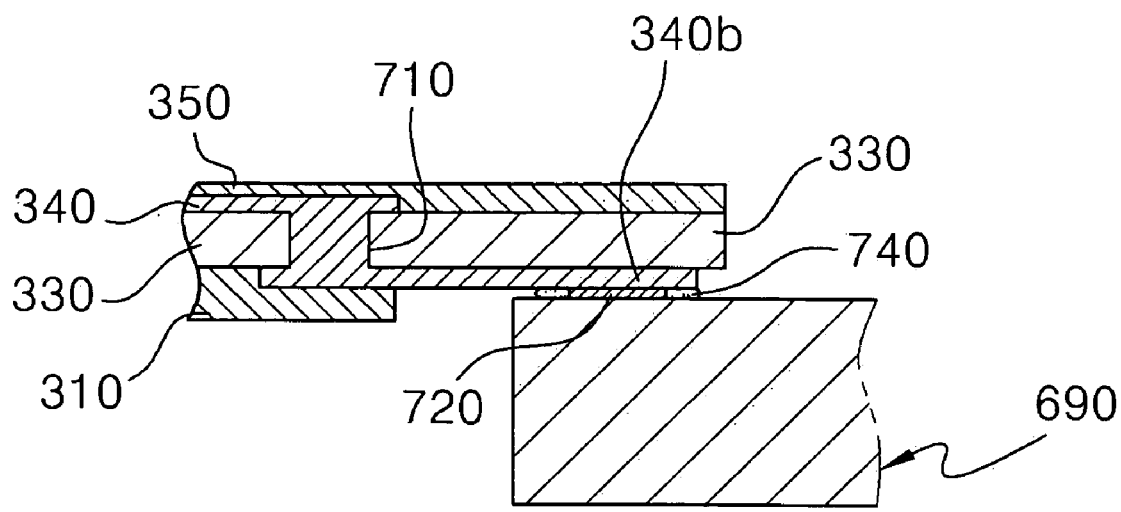

FIGS. 8 and 9 may be partial sectional views showing outer leads of a tape circuit substrate according to an exemplary embodiment of the present invention. Electrical connection of the outer leads shown in FIGS. 8 and 9 may be different from electrical connection of the inner leads shown in FIGS. 5a and 5b.

In the tape circuit substrate for the inner leads, the second wiring pattern layer 340 may overlap above the first wiring pattern layer 320 and the via-holes 360 may be formed in the base film 330 such that the second wiring pattern layer 340 may be electrically connected with the semiconductor chip 420 through the base film 330. In the tape circuit substrate for the outer leads, the first wiring pattern layer and the second wiring pattern layer may be formed such that they may not overlap each other. The via-holes may be formed in the base film 330 below the top surface, i.e. the second surface of the second wiring pattern layer 340.

FIG. 8 may be a partial sectional view showing one outer lead E shown in FIG. 7. As shown in FIG. 8, in another exemplary embodiment of the present invention, the semiconductor chip package may comprise a tape circuit substrate which may include the base film 330 and the first wiring pattern layer 320, and an LCD panel 690, which may be electrically connected with the tape circuit substrate.

The first wiring pattern layer 320 which may be formed on the first surface of the base film 330 may be covered with and protected by the protection film 310 which may be made of solder resist. This protection film 310 may cover the bottom surface of the base film 330 such that the first wiring pattern layer 320 may not be exposed. However, an outer lead 320b may be electrically connected with the LCD panel 690 and may not be covered with the protection film 310.

Through a thermal welding process, the outer lead 320b may be electrically connected with a panel pattern 660 which may be formed on the main surface of the LCD panel 690. The outer lead 320b and the panel pattern 660 may be thermally welded to each other with an anisotropic conductive film 670 (hereinafter referred to as "ACF") filled between them.

FIG. 9 may be a partial sectional view shown one outer lead F shown in FIG. 7. In an exemplary embodiment of the present invention, the semiconductor chip package may comprise a tape circuit substrate which may include the base film 330 and the second wiring pattern layer 340. The LCD panel 690 may be electrically connected with the tape circuit substrate.

A via-hole 710 may be formed in the base film 330 such that the second wiring pattern layer 340 may be electrically connected with the panel pattern 720 of the LCD panel 690 through the base film 330. The second wiring pattern layer 340 may be electrically connected with a terminal 340b which may be formed on the first surface of the base film 330 through the via-hole 710 and may be filled with a conductive material, or plug.

The terminal 340b of the second wiring pattern layer 340 may be electrically connected with a panel pattern 720 which may be formed on the main surface of the LCD panel 690. The terminal 340b and the panel pattern 720 may be thermally welded to each other with an ACF 740 filled between them.

The second wiring pattern layer 340, which may be formed on the second surface of the base film 330, may be covered with and protected by the protection film 350 which may be made of solder resist. This protection film 350 may cover the top surface of the base film 330 such that the second wiring pattern layer 340 may not be exposed.

Figure 10:
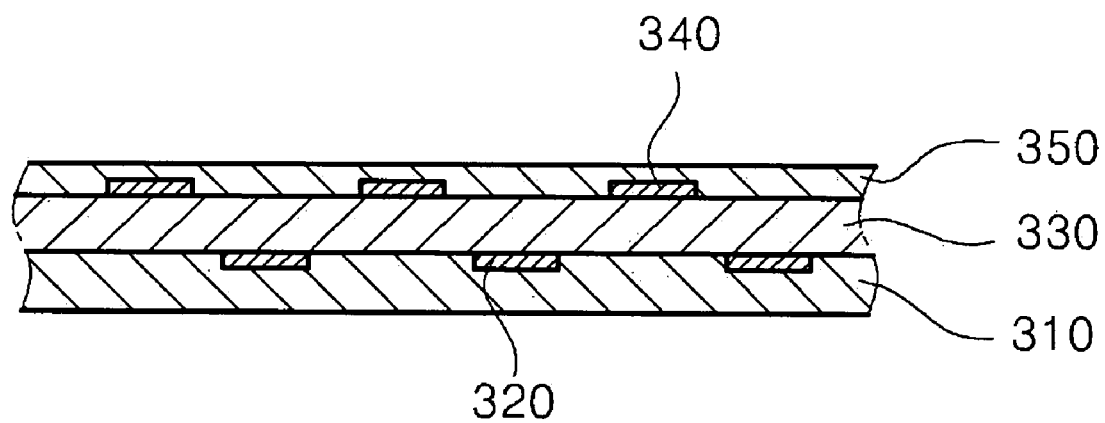
FIG. 10 is a sectional view taken along line H–H' of FIG. 7.

FIG. 10 may be a sectional view taken along line H–H' of FIG. 7. The first wiring pattern layer 320 may be formed on a first surface of the base film 330 and the second wiring pattern layer 340 may be formed on a second surface of the base film 330. The wirings on the second wiring pattern layer 340 may be located between wirings on the first wiring pattern layer 320. The wiring on the first wiring pattern layer 320 and the wiring on the second wiring pattern layer 340 may not overlap each other.

Although the wiring pattern layers having a two-layered structure have been described by way of exemplary embodiments of the present invention, the present invention may also be applied to the wiring pattern layers having a three- or more-layered structure.

Although exemplary embodiments of the present invention have been described such that a chip bump may be used to connect a semiconductor chip to the tape circuit substrate and a anisotropic conductive film (ACF) may be used to connect an LCD panel to the tape circuit substrate, it will be understood by those of ordinary skill in the art that the chip bump and ACF may be used interchangeably, or in combination.

Although the TCP has been described by way of exemplary embodiments of the present invention, the present invention may be applied to a chip on film (COF) to which the TAB technology may also be applied.

In exemplary embodiments of the present invention, a wiring pattern layer of a two- or more-layered structure which may be formed on a surface of a base film may be electrically connected to a semiconductor chip or LCD panel through via-holes which may be connected to the wiring pattern layer, whereby a fine pitch may be achieved for a tape circuit substrate and/or semiconductor chip package. The number of leads which may be formed on one layer may be reduced, the width of leads may be increased, the interval between the leads may widen, thus, the flexibility of the bump arrangement structure may be increased and the pitch may be reduced.

Although the present invention has been described in connection with the exemplary embodiments thereof, it may not be limited to these exemplary embodiments. It will be apparent to those skilled in the art that various changes and modifications may be made thereto without departing from the scope and spirit of the present invention defined by the appended claims.

What is claimed is:

1. A tape circuit substrate, comprising:
   a base film;
   a first wiring pattern layer formed on at least a portion of a first surface of the base film; and
   at least one second wiring pattern layer formed on at least a portion of a second surface of the base film; wherein
   inner leads connected to a semiconductor chip include
      one end of the first wiring pattern, and
      a first terminal formed on the first surface of the base film and connected to one end of the second wiring pattern through at least one first via-hole formed in a portion of the base film,
   outer leads connected to a panel or a circuit board include
      the other end of the first wiring pattern, and
      a second terminal formed on the first surface of the base film and connected to the other end of the second wiring pattern through at least one second via-hole formed in a portion of the base film,
   one end of the first wiring pattern overlaps the second wiring pattern, and
   the other end of the first wiring pattern does not overlap the second wiring pattern.

2. The tape circuit substrate as claimed in claim 1, wherein the first and second wiring pattern layers are sealed by at least one protection film.

3. The tape circuit substrate as claimed in claim 2, wherein the at least one protection film is made of solder resist.

4. The tape circuit substrate as claimed in claim 2, wherein when there are two or more second wiring pattern layers, an insulating film is formed between the second wiring pattern layers so that the second wiring pattern layers are electrically insulated from one another.

5. The tape circuit substrate as claimed in claim 4, wherein the insulating film is made of solder resist.

6. The tape circuit substrate as claimed in claim 1, wherein the at least one via-hole is formed in one or more rows.

7. The tape circuit substrate of claim 1, wherein the second surface is opposite to the first surface of the base film.

8. The tape circuit substrate of claim 1, wherein the base film is made of an insulating material.

9. The tape circuit substrate of claim 1, wherein the at least one second wiring pattern layer is electrically connected to the second terminal through conductive materials filled in the at least one second via-hole.

10. A semiconductor chip package, comprising:
    a tape circuit substrate including
    a base film,
    a first wiring pattern layer formed on at least a portion of a first surface of the base film, and
    at least one second wiring pattern layer formed on at least a portion of a second surface of the base film; and
    a semiconductor chip including
    a plurality of electrode pads with bonded portions formed thereon at a main surface thereof, the semiconductor chip being electrically connected to the first wiring pattern layer and the at least one second wiring pattern layer through the bonded portions, wherein
       inner leads connected to the semiconductor chip include
          one end of the first wiring pattern, and
          a first terminal formed on the first surface of the base film and connected to one end of the second wiring pattern through at least one first via-hole formed in a portion of the base film,
       outer leads connected to a panel or a circuit board include
          the other end of the first wiring pattern, and
          a second terminal formed on the first surface of the base film and connected to the other end of the second wiring pattern through at least one second via-hole formed in a portion of the base film,
       one end of the first wiring pattern overlaps the second wiring pattern, and
       the other end of the first wiring pattern does not overlap the second wiring pattern.

11. The semiconductor chip package as claimed in claim 10, wherein the bonded portions are chip bumps.

12. The semiconductor chip package as claimed in claim 11, wherein when there are two or more second wiring pattern layers, an insulating film is formed between the second wiring pattern layers so that the second wiring pattern layers are electrically insulated from one another.

13. The semiconductor chip package as claimed in claim 12, wherein the insulating film is made of solder resist.

14. The semiconductor chip package as claimed in claim 10, further comprising a sealing portion which seals electrical connections between the tape circuit substrate and the semiconductor chip with insulation sealing resin.

15. The semiconductor chip package of claim 10, wherein the second surface is opposite to the first surface of the base film.

16. The semiconductor chip package of claim 10, wherein the base film is made of an insulating material.

17. The semiconductor chip package of claim 10, wherein the at least one second wiring pattern layer is electrically connected to the second terminal through conductive materials filled in the at least one second via-hole.

18. An LCD package comprising:
a tape circuit substrate including
a base film,
a first wiring pattern layer formed on at least a portion of a first surface of the base film, and
at least one second wiring pattern layer formed on at least a portion of a second surface of the base film;
a semiconductor chip including
a plurality of electrode pads with bonded portions formed thereon at a main surface thereof, the semiconductor chip being electrically connected to the first wiring pattern layer and the at least one second wiring pattern layer through the bonded portions; and
an LCD panel including
at least one panel pattern formed thereon at a main surface thereof, the LCD panel being bonded to at least one of the at least one second wiring pattern layers, through a conductive film, wherein
inner leads connected to the semiconductor chip include
one end of the first wiring pattern, and
a first terminal formed on the first surface of the base film and connected to one end of the second wiring pattern through at least one first via-hole formed in a portion of the base film,
outer leads connected to a panel or a circuit board include
the other end of the first wiring pattern, and
a second terminal formed on the first surface of the base film and connected to the other end of the second wiring pattern through at least one second via-hole formed in a portion of the base film,
one end of the first wiring pattern overlaps the second wiring pattern, and
the other end of the first wiring pattern does not overlap the second wiring pattern.

19. The LCD package of claim 18, wherein the conductive film is an anisotropic conductive film.

20. The LCD package of claim 18, wherein the bonded portions are chip bumps.

21. The LCD package of claim 20, wherein when there are two or more second wiring pattern layers, an insulating film is formed between the second wiring pattern layers so that the second wiring pattern layers are electrically insulated from one another.

22. The LCD package of claim 21 wherein the insulating film is made of solder resist.

23. The LCD package of claim 18, further comprising a sealing portion which seals electrical connections between the tape circuit substrate and the semiconductor chip with insulation sealing resin.

24. The LCD package of claim 18, wherein the second surface is opposite to the first surface of the base film.

25. The LCD package of claim 18, wherein the base film is made of an insulating material.

26. The LCD package of claim 18, wherein the at least one second wiring pattern layer is electrically connected to the second terminal through conductive materials filled in the at least one second via-hole.

* * * * *